METHODS AND APPARATUS FOR IMPROVING THE PRACTICAL SELECTIVITY OF FREQUENCY-SELECTIVE AMPLIFIERS

Filed May 1, 1956

INVENTOR.
WILLIAM R. RAMBO

BY W R Maltby
Paul M. Klein Jr.
ATTORNEYS

United States Patent Office 2,956,152

Patented Oct. 11, 1960

2,956,152

METHODS AND APPARATUS FOR IMPROVING THE PRACTICAL SELECTIVITY OF FREQUENCY-SELECTIVE AMPLIFIERS

William R. Rambo, San Jose, Calif., assignor, by mesne assignments, to the United States of America as represented by the Secretary of the Navy Filed May 1, 1956, Ser. No. 582,051

4 Claims. (Cl. 250—20)

This invention relates to methods and apparatus for improving the practical selectivity of frequency-selective amplifiers.

Certain frequency selective amplifiers exhibit the undesirable characteristic of passing through themselves signals not in the frequency range to which the amplifier is instantaneously tuned, i.e., the range of maximum response. An example of such an amplifier is a "dispersive" travelling wave tube amplifier with reference to which, by way of example only, this invention will be described. In such a T.-W. tube amplifier, off-frequency signals of perhaps 35 db or more above minimum, detectable amplitude feed through to the detriment of the operation of the receiver of which the T.-W. tube amplifier forms a part. When used in a rapid-scan radar intercept receiver, for example, following circuits may be triggered incorrectly and the visual display is apt to be overloaded and confused.

Principal objects of the present invention are, therefore, to provide methods and apparatus for eliminating receiver response to and the subsequent undesirable display of strong signals which otherwise would feed through a frequency-selective amplifier even when those signals were not in the frequency range to which the amplifier was instantaneously tuned.

Other objects and many of the attendant advantages of this invention will be readily appreciated as the same becomes better understood by reference to the following detailed description when considered in connection with the accompanying drawing wherein.

Figure 1:
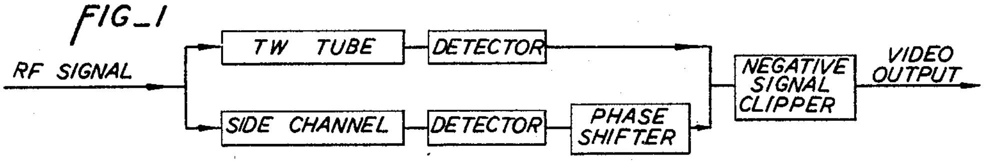
Fig. 1 is a block diagram showing an apparatus using one preferred embodiment of the invention.

In the somewhat related field of static or electronic noise elimination certain prior art is known wherein static, constituted typically by an unwanted modulation of one particular desired R.-F. signal of known frequency, is attempted to be reduced or eliminated by splitting the incoming R.-F. signal; passing a portion of it through a first circuit tuned to the one particular desired frequency; passing a second portion of it through a second tuned circuit detuned slightly with respect to the frequency of the first circuit so that it will ostensibly pass none of the desired frequency but will pass, on its own frequency, the noise that has modulated the desired signal; and then combining the outputs of these two tuned circuits in voltage-opposing relation so that the noise, described as "aperiodic waves" which affect both tuned circuits with substantially equal voltages, is cancelled while the desired signal passes more or less unaffected through the system because it meets substantially no opposing signal voltages in the detuned circuit. Such an apparatus would not serve the purpose of the present invention which is required to be applicable to rather broad band amplifiers which may pass appreciable signals well out of the incremental frequency range to which the amplifier is tuned. Other prior art noise eliminators, instead of attempting to cancel unwanted signals at R.-F., take a detected signal, choose a necessarily limited noise frequency band to be eliminated; split the detected signal and pass one portion of the signal through a filter which allows to pass through it only the noise frequency band and does not permit passage of the desired signal frequency; pass the other portion of the split detected signal, including the noise, through a second channel, and combine the outputs of the two channels in such a way that the effect of the noise of the other, thus permitting the net output to consist entirely of desired signals. This type of apparatus cannot work with a wide variety of signals such as encountered in the apparatus to which the present invention is applicable.

The function of this invention can perhaps most easily be understood from consideration of a problem inherent in a particular type of receiver in a certain situation. Choosing a travelling wave tube receiver for example only, let it be assumed that it is desired to use this receiver for the purpose of sensing the presence of an R.-F. signal, such as a radar pulse, at a certain particular frequency or within a (relatively narrow) frequency band centered at the particular frequency. To accomplish this sensing, the receiver is tuned to the desired R.-F. frequency or frequency band to search for the presence of a signal and if the receiver thereupon exhibits a response, for example by showing a spike on its cathode ray oscilloscope, it would then be concluded that there was present a signal at the particular search frequency or frequency band to which the receiver had been instantaneously tuned. This conclusion would be correct only if the R.-F. stage of the receiver were so sharply tunable as to allow to pass through only those signals arriving at precisely that search frequency or band to which the receiver was tuned. However, in the case of some types of receivers, exemplified by a T.-W. tube receiver wherein the R.-F. stage includes a T.-W. tube, the characteristic frequency response curve of the R.-F. stage is similar to that labelled "T-W channel response" in Fig. 2(A) and shows that the R.-F. stage will allow to pass through, albeit at relatively lower levels, arriving signals at frequencies both higher and lower than the search frequency. Thus, if, while the receiver is tuned to search for signals in the frequency band labelled $\Delta F$, a signal should arrive at say frequency $f_1$ or $f_2$ on the skirt of the response curve, this signal would nevertheless pass on through and show up as a video pulse. An observer seeing this response of the receiver would then erroneously report that there had been sensed the presence of a signal at frequency $\Delta F$. For eliminating this undesirable response of a receiver to off-frequency signals, the system embodying the methods and apparatus of the present invention described, by way of example, with reference to a T.-W. tube amplifier, involves (1) splitting the incoming signal at R.-F., (2) feeding a portion of the split R.-F. signal to the T.-W. tube amplifier, (3) by-passing the T.-W. tube with a second portion of the split R.-F. signal, and (4) combining the detected output signals of the two channels in such a way that there is a net output to the following stage only if, by comparison on an amplitude basis, the signal through the T.-W. tube is larger than that through the side channel, with the result that off-frequency signals are completely rejected. By an initial setting of relative channel gains, the apparent response width of the T.-W. tube is held reasonably invariant and independent of signal amplitude since the operation is dependent on relative rather than absolute levels.

Various means can be used to accomplish the aforedescribed method of this invention, certain of which are explained hereinafter.

Figure 2:
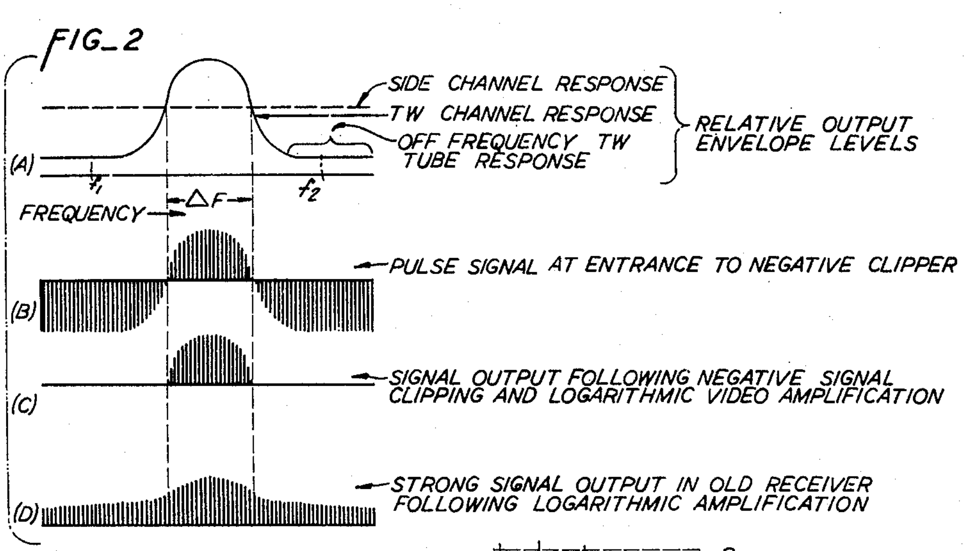
Fig. 2 is a series of related plots of amplitude versus frequency, explaining the operation of the present invention and how it improves receiver response.

Reference is now made to Fig. 1 of the drawing which shows a block diagram for illustrating the principles of the invention in an elementary way. It represents an apparatus using a preferred embodiment of the invention wherein the comparison of amplitudes of the output signals is done at video. The R.-F. signal is split with one portion entering the T.-W. tube and the other portion entering the side channel. The T.-W. tube amplifies the frequency band to which it is tuned but also passes with appreciable response frequencies off to either side of the desired frequency to which the tube is tuned. The side channel is non-selective and hence passes all these frequencies, desired or undesired, with equal response. To accomplish the combining of the signals from the two channels with comparison on an amplitude basis and rejection of off-frequency signals, the system of this embodiment uses means for detecting the signal in each channel and means for subtracting the two detected signals followed by polarity-sensitive means which will pass the signal representing the difference obtained by the subtraction only when it is of one predetermined polarity. Although various means can be used to perform the subtraction and off-frequency rejection processes, the preferred embodiment uses phase shifting means, perhaps more accurately named envelope-inverting means, and negative clipping means, respectively, for the purposes. The output of the T.-W. tube passes through a detector, and the output of the side channel passes through another detector. The output of the two detectors being combined in polarity-opposed relation to one another and so that they add algebraically. The output of each detector is, of course, the envelope of its modulated R.-F. input signal. To prepare the two outputs for algebraic addition to one another in polarity-opposed relation it suffices to invert one envelope relative to the other. The responses of the two channels are indicated in part (A) of Fig. 2 where $\Delta F$ represents the frequency band to which the T.-W. tube is tuned. When the detected signals, considered as pulses for purposes of illustration, are combined after relative envelope inversion so that they effectively subtract, then there is obtained at the entrance to the negative signal clipper a pulse signal whose polarity and amplitude can be determined from the graph shown in part (B) of Fig. 2 which is a plot of amplitude of pulse signal at the entrance to the negative clipper versus frequency, wherein the length of each vertical line represents the amplitude of the pulse signal entering the negative clipper when an R.-F. pulse at only that frequency where that vertical line is located reaches the antenna of the receiver, during the time while the receiver is tuned to the search frequency $\Delta F$. A plot such as shown in Fig. 2(B) is obtained by tuning the receiver to the search frequency $\Delta F$ and leaving it there while a series of signals at each of the frequencies represented by the vertical lines is sequentially and individually directed at the antenna of the receiver and the resulting pulse signal at the entrance to the negative clipper is observed and recorded. This resulting pulse signal exhibits a change in polarity at the point of cross-over of the channel gains, which occurs at the limits of the frequency band to which the T.-W. tube is tuned. After negative signal clipping and logarithmic video amplification, the desired signal response graph appears as shown in part (C) of Fig. 2. From part (C) of Fig. 2 it is apparent that all signals at undesired frequencies have been completely eliminated. For comparison there is shown in part (D) the strong signal output response graph in a typical receiver prior to being provided with the present invention.

Figures 3, 4:
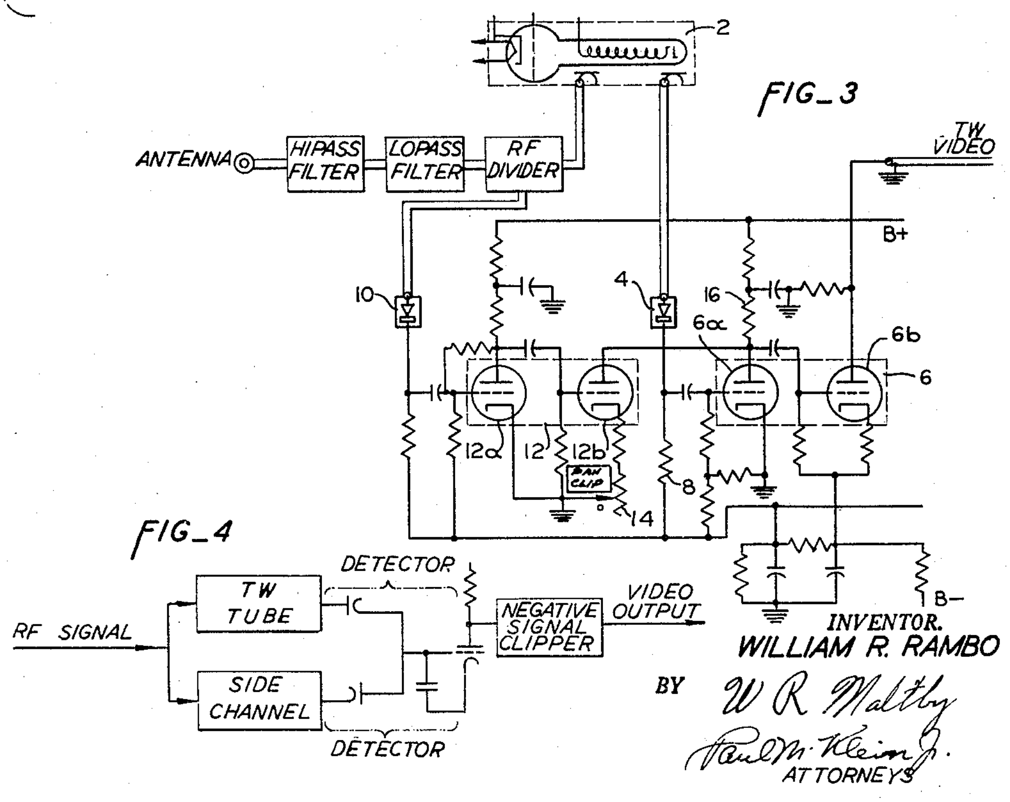
Fig. 3 is a circuit diagram showing the invention as actually applied to a particular equipment.
Fig. 4 is a schematic block diagram similar to Fig. 1 showing a particular phase-shifting arrangement.

In Fig. 3 there is shown a schematic circuit diagram showing the present invention in use in a particular rapid-scan radar intercept receiver. The basic element of the rapid-scan receiver is a dispersive T.-W. tube 2, operated as a voltage-tuned amplifier. Operated in this fashion, the frequency of maximum amplification is determined by the voltage applied to the helix. Within the amplified frequency band, gains in a typical tube of as much as 20 db are realized while signals outside the band to which the T.-W. tube is instantaneously tuned are attenuated by as much as 10 db, giving a total rejection of 30 db. Electronic tuning is accomplished by applying an appropriately varying voltage to the T.-W. tube helix. When this is done in synchronism with the horizontal sweep applied to a cathode ray tube, a panoramic display of received signals versus frequency results.

The input signal from the antenna, after passing through high-pass and low-pass filters, is split by the R.-F. divider and part of it is applied to the input helix match of the T.-W. tube. After amplification the R.-F. signal is obtained at the output helix match (both matches being included within the T.-W. tube capsule) and is taken to the crystal detector 4, from which the output video signal is applied to the preamplifier. The detector 4 includes, for example, a silicon crystal diode which converts the pulsed R.-F. signals directly to video pulses which are then applied to the panoramic video preamplifier tube 6. The crystal is placed in a broad band untuned mount which provides good sensitivity over the frequency range of the receiver. The crystal holder has low output capacitance to allow retention of waveshape of the detected pulses. A resistor 8 is used to bias the crystal 4 in the forward direction to further improve the video pulse shape.

The video is coupled from the crystal detector 4 to the grid of the first preamplifier tube 6A which can be half of a twin triode. At the plate of 6A the signal is combined with the video from the cancellation preamplifier tube, hereinafter described, and is then coupled to the grid of the preamplifier output tube 6B, the other half of the twin triode. Since the video output from the detector 4 is positive, the two stages of amplification result in positive video from the preamplifier.

The need for a cancellation amplifier in this apparatus arises for reasons hereinbefore indicated, namely, the limited dynamic range of the T.-W. tube as an R.-F. filter. In a typical T.-W. tube off-frequency response may be as little as 30 db down. Thus, strong signals may be fed to the video amplifiers regardless of T.-W. tube tuning and, because of the logarithmic amplifier characteristics, can appear as large signals over excessive widths of the cathode ray tube display. The result is very objectionable screen clutter encountered in the presence of very strong local signals.

In accordance with the method of the invention, the operation of the cancellation amplifier utilizes the dynamic range of the T.-W. tube that does exist in a comparison process against the detected signal from a channel with no R.-F. selectivity. In the nominal pass-band of the T.-W. tube, the T.-W. tube channel signal will be larger; it will be smaller off-frequency because of the T.-W. tube attenuation. If the signals are subtracted, there will be a change in polarity at the amplitude cross-over points. Subsequent "polarity-sensitive" circuits, such as negative clipper circuits, then "cancel" out (i.e. reject) the off-frequency response. The operation is based on relative rather than absolute signal levels and is independent of incoming signal strength. Response width is set by the cross-over point in amplitude in the two channels and can be set to a maximum limit close to the small-signal response width of the T.-W. tube.

The cancellation amplifier takes a fraction of the incoming signal from the R.-F. divider and applies it to the cancellation video detector 10 which can also conveniently be a crystal detector. The resulting positive video output is coupled directly to the preamplifier 12 which can include a twin triode composed of 12A and 12B. A D.C. feedback path provides proper grid bias for this tube over a wide variation of tube characteristics, but otherwise this amplifier is similar to preamplifier 6. From tube 12A the cancellation video is amplified by 12B by an amount determined by the variable cathode resistor 14. The two stages of cancellation video amplification provide a positive video output which is combined with the negative T.-W. tube video at the plates of 6A and 6B in the common plate load resistor 16 to accomplish the polarity reversal. Resistor 14 varies the gain of the cancellation video channel and thus determines the limits of the cancellation process. This adjustment is termed the "Pan Clip" control because of its effect on the sides of the pulse envelopes as seen on the panoramic display.

While a group of triodes, each being referred to as an individual vacuum tube (although in practice a pair may be included within the same envelope), is used to produce a relative envelope inversion required by the invention, other envelope-inverting means can be used. For example, the elements of the rectifiers of the two detectors may be connected in opposite relation to a common condenser, i.e. with the collector of one tied to the emitter of the other, as shown in the block diagram of Fig. 4.

Obviously many other modifications and variations of the present invention are possible in the light of the above teachings. It is, therefore, to be understood that within the scope of the appended claims the invention may be practiced otherwise than as specifically described.

What is claimed is:

1. In combination in a receiver for receiving information transmitted at radio frequencies; means for dividing an incoming R.-F. signal; a first channel connected to said dividing means for receiving therefrom a portion of said divided R.-F. signal, said first channel being characterized by passing through itself signals in the desired frequency band to which it is instantaneously tuned but also passing through itself at an appreciable level signal off of the frequency band to which it is tuned, the amplitude of the passed signals in the desired band being substantially greater than the amplitude of the off-frequency signals; a by-pass channel having substantially no R.-F. selectivity connected to said dividing means for receiving therefrom another portion of said divided R.-F. signal; means for detecting the signal output of said first channel; means for detecting the signal output of said by-pass channel; and means for combining in polarity-opposed relation to one another the detected signals from said two detecting means so that they add algebraically, whereby the polarity of a detected signal resulting from incoming signal arriving in the off-frequency region is made opposite to the polarity of a detected signal resulting from incoming signal arriving in the desired frequency band.

2. In combination in a receiver for receiving information transmitted at radio frequencies; means for dividing an incoming R.-F. signal; a first channel connected to said dividing means for receiving therefrom a portion of said divided R.-F. signal, said first channel being characterized by passing through itself signals in the desired frequency band to which it is instantaneously tuned but also passing through itself at an appreciable level signals off of the frequency band to which it is tuned, the amplitude of the passed signals in the desired band being substantially greater than the amplitude of the off-frequency signals; a by-pass channel having substantially no R.-F. selectivity connected to said dividing means for receiving therefrom another portion of said divided R.-F. signal; means for detecting the signal in said first channel; means for detecting the signal in said second channel; and means for combining the detected output signals of the two channels so that there is a net output to the following stage only if the amplitude of the detected signal through said first channel is greater than the amplitude of the detected signal through said side channel.

3. In combination in a receiver for receiving information transmitted at radio frequencies; means for dividing an incoming R.-F. signal; a first channel connected to said dividing means for receiving therefrom a portion of said divided R.-F. signal, said first channel including a travelling wave tube characterized by passing through itself signals in the desired frequency band to which it is instantaneously tuned but also passing through itself at an appreciable level signals off of the frequency band to which it is tuned, the amplitude of the passed signals in the desired band being substantially greater than the amplitude of the off-frequency signals; a by-pass channel having substantially no R.-F. selectivity connected to said dividing means for receiving therefrom another portion of said divided R.-F. signal; means for detecting the signal output of said first channel; means for detecting the signal output of said by-pass channel; a first vacuum tube having an anode, a cathode, and a grid, its grid being connected to said first detecting means to receive the detected signal output of said first detecting means; a second vacuum tube including an anode, a cathode, and a grid, its grid being connected to said second detecting means to receive the detected signal therefrom; and a third vacuum tube having an anode, a cathode, and a grid, its grid being coupled to the anode of said second vacuum tube and its anode being tied directly to the anode of said first vacuum tube whereby the detected output signals from said two detecting means are combined in polarity-opposed relation to one another so that they add algebraically.

4. The apparatus of claim 3 further including a fourth vacuum tube having an anode, a cathode, and a grid with its grid coupled to the common anode connection of said first and third vacuum tubes; and polarity-sensitive means connected to the anode of said fourth vacuum tube for accepting signals of one polarity and rejecting those of the opposite polarity.

References Cited in the file of this patent

UNITED STATES PATENTS

| | | |
|---|---|---|
| 2,113,212 | Landon | Apr. 5, 1938 |
| 2,228,084 | Murcek | Jan. 7, 1941 |
| 2,258,283 | Feld | Oct. 7, 1941 |
| 2,394,544 | Gottier | Feb. 12, 1946 |
| 2,450,818 | Vermillion | Oct. 5, 1948 |
| 2,468,030 | Bullock | Apr. 26, 1949 |
| 2,657,305 | Knol et al. | Oct. 27, 1953 |

FOREIGN PATENTS

| | | |
|---|---|---|
| 893,177 | France | Jan. 24, 1944 |